United States Patent [19]

Sadamatsu et al.

[11] Patent Number: 4,631,419
[45] Date of Patent: Dec. 23, 1986

[54] TRANSISTOR SWITCH AND DRIVER CIRCUIT

[75] Inventors: Hiroshi Sadamatsu; Yoshio Wada, both of Yokohama; Hideaki Ito, Kawasaki, all of Japan

[73] Assignee: Tokyo Shibaura Denki Kabushiki Kaisha, Kawasaki, Japan

[21] Appl. No.: 565,177

[22] Filed: Dec. 23, 1983

[30] Foreign Application Priority Data

Dec. 28, 1982 [JP] Japan ................... 57-233563

[51] Int. Cl.$^4$ .................... H03K 17/60; H03K 3/26
[52] U.S. Cl. .................... 307/255; 307/270; 307/288; 307/313; 307/254
[58] Field of Search .............. 307/248, 253, 254, 255, 307/270, 256, 288, 596, 313

[56] References Cited

FOREIGN PATENT DOCUMENTS 0096422 6/1983 Japan .
0721919 3/1980 U.S.S.R. .

OTHER PUBLICATIONS

"Solid-State Switch", by R. L. Whale, vol. 7, No. 11, Apr. 1965, pp. 1113-1114, IBM Technical Disclosure Bulletin.

Primary Examiner—Stanley D. Miller
Assistant Examiner—Richard Roseen
Attorney, Agent, or Firm—Finnegan, Henderson, Farabow, Garrett & Dunner

[57] ABSTRACT

A switch circuit is comprised of first and second NPN transistors, the collectors of which are interconnected and the emitters of which are respectively connected to an input terminal and a reference voltage, third and fourth PNP transistors connected between the bases of said first and second transistors and a power source voltage, and fifth and sixth NPN transistors connected between the bases of the third and fourth transistors and ground. Seventh and eighth PNP transistors, connected between the power source and ground, are further provided, with their ON and OFF states being controlled by a control signal applied to the bases thereof. The bases of the fifth and sixth transistors are respectively connected to the collectors of the seventh and eighth transistors. The fifth and sixth transistors are ON/OFF controlled by the collector currents of the seventh and eighth transistors, respectively.

4 Claims, 5 Drawing Figures

TRANSISTOR SWITCH AND DRIVER CIRCUIT

BACKGROUND OF THE INVENTION

The present invention relates to an analog switch circuit which is used as a recording switch in a tape recorder and, more particularly, to a switch circuit of the type in which a signal with high peak values is applied to the input of the switch circuit when said circuit is in an OFF state.

A typical example of the kind of switch employed in this type of switch circuit is the recording switch of a tape recorder. The switch circuit using such a switch requires a high breakdown withstand voltage against the positive and negative peak values of the input voltage signal applied to the circuit in an OFF state.

FIG. 1 schematically illustrates circuitry containing a record switch circuit and a playback switch circuit. In the figure, reference numeral 11 designates a magnetic head; and, 13, a playback preamplifier. Reference numeral 14 designates a biasing oscillator of the magnetic head 11; SW1 and SW2, switch circuits; C1 to C3, coupling capacitors; and, R1, a resistor.

The operation of the circuitry thus arranged, in record and playback modes, may be described as follows. In a playback mode, the switch SW1 is ON, while the switch circuit SW2 is OFF. Also, in a playback mode, the biasing oscillator 14 does not operate. An acoustic signal read out by the magnetic head 11 is amplified by the preamplifier 13 and sent to a speaker (not shown) connected to the output of the amplifier 13. The read out signal in this mode is very small and its positive and negative peak values are several mV, at most. Therefore, a large breakdown withstand voltage is not required for the switch SW2. In a record mode, the switch circuit SW1 is OFF, while the switch circuit SW2 is ON. A record signal applied from a microphone (not shown) through the recording amplifier 12 is superposed on the output voltage of the biasing oscillator 14, of which the positive and negative peak values are each about 50 V, and then is applied to the magnetic head 11. Accordingly, a maximum of about 100 V of DC voltage is applied to the switch circuit SW1 when it is OFF. In this respect, a breakdown withstand voltage of 100 V or more is required for the switch circuit SW1.

When the switch circuit SW1 is fabricated into a discrete circuit, it is sufficient to use a transistor whose collector-emitter voltage $V_{CBO}$ is high in an open state. However, when the switch circuit SW1 is fabricated for an integrated circuit, it must have a breakdown withstand voltage high enough to withstand the positive and negative peak values of the applied voltage, with respect to a 0 V level, due to the presence of the diode element, which is parasitically formed. At the present stage of technology in this field, it is difficult to obtain such a high breakdown withstand voltage.

The above problem may now be described in greater detail. When the switch circuit SW1, as shown in FIG. 2, is formed in a discrete circuit, a couple of NPN transistors are connected in series between an input terminal, Tin, and a reference voltage terminal (generally ground,) Tref, with the emitters thereof being interconnected. The switch circuit is controlled by applying control signal S to the bases of the transistors Q1 and Q2. When the circuit as shown in FIG. 3, is fabricated into an integrated circuit, parasitic diodes D1 and D2 are formed between the collector regions of the transistors Q1 and Q2 and the semiconductor substrate Sub. Therefore, to increase the breakdown withstand voltage of the circuit, against the input voltage signal applied to the input terminal Tin, the substrate Sub must be set in an open state, from a potential standpoint. Generally, in the integrated circuit, a plurality of circuits are formed within a single semiconductor chip. Therefore, it is impossible to potentially open the substrate Sub for a specific circuit, in order to prevent an erroneous operation of the remaining circuits. Thus, in the integrated circuits, the substrate Sub is not generally set in an open state. Further, when the switch circuit is fabricated into the integrated circuit, a positive voltage of the AC voltage signal applied to the input terminal Tin is clamped by the parasitic diodes D1 and D2 at a value dropped by a forward voltage drop Vf across the parasitic diodes D1 and D2. The result is a deformation of the waveform of the input voltage signal.

A conventional switch circuit fabricated in the integrated circuit manner, which has succeeded in solving the above problems, is arranged as shown in FIG. 4. As shown, a PNP transistor Q3 is connected between the reference voltage terminal Tref and the input terminal Tin. An NPN transistor Q4 is connected between the base of the transistor Q3 and the substrate Sub. A control signal S is applied to the base of the transistor Q4, to control the ON and OFF states of the switch circuit. This approach reduced the adverse effect caused by the parasitic diode when the switch circuit is fabricated into an integrated circuit. This approach is defective, in that it requires two power sources, positive and negative; since the reference voltage is set at 0 V.

SUMMARY OF THE INVENTION

Accordingly, a primary object of the present invention is to provide a switch circuit which is adaptable for use in integrated circuits; allows a reference voltage to be set at ground level, even if a single power source is used; and has a high breakdown withstand voltage against the positive and negative peak values of the input voltage signal which alternately swings to the positive and negative sides with respect to the ground level.

According to the invention, there is provided a switch circuit comprising first and second transistors, the collectors of which are interconnected, and the emitters of which are respectively connected to an input terminal and ground, and base current supplying means connected to the base electrodes of said first and second transistors, the supply of the base current being controlled by a control signal.

DETAILED DESCRIPTION OF THE PREFERRED EMBODIMENT

Figure 1:
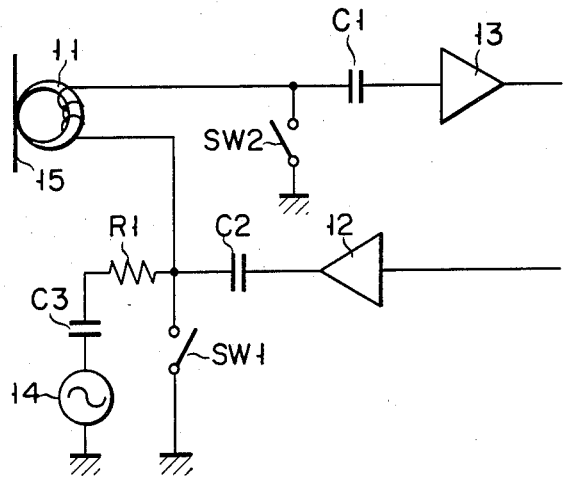
FIG. 1 is a circuit diagram of a circuit containing the record and playback switching circuits of a tape recorder.
Figure 2:
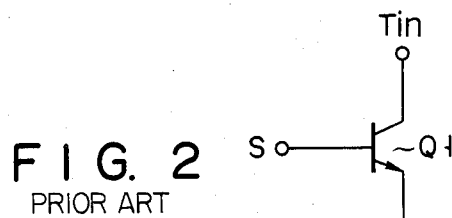
FIG. 2 is a circuit diagram of a conventional switching circuit which is fabricated into a discrete circuit.
Figure 3:
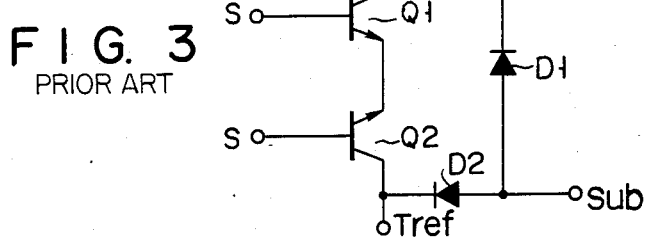
FIG. 3 shows an equivalent circuit of the switching circuit shown in FIG. 2, when it is fabricated in an integrated circuit manner.
Figure 4:
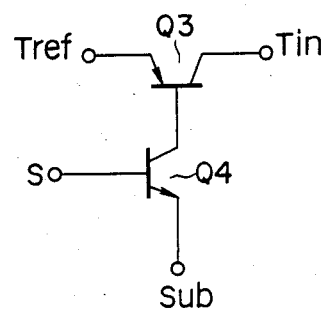
FIG. 4 is a circuit diagram of a conventional switching circuit which is fabricated into an integrated circuit.
Figure 5:
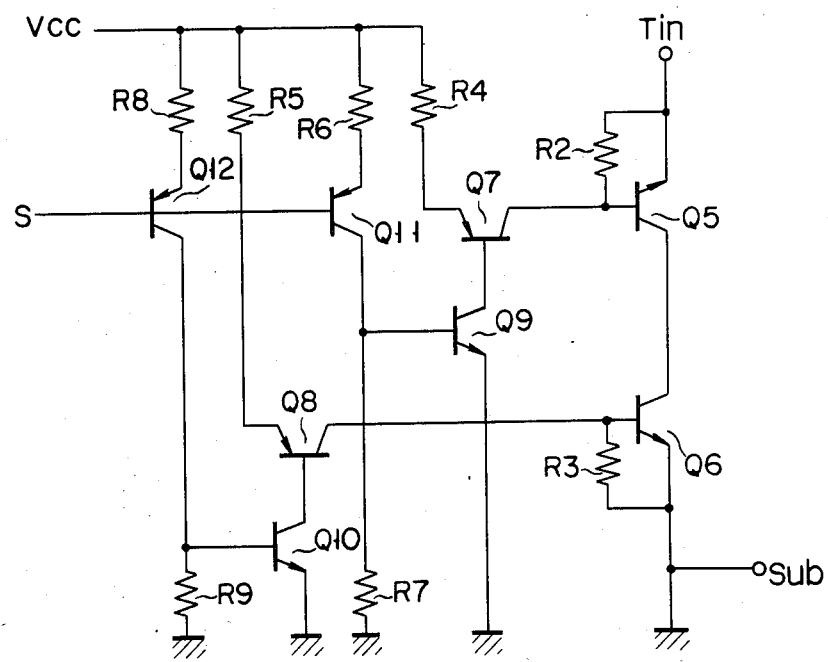
FIG. 5 is a circuit diagram of a switching circuit which is an embodiment of the present invention.

An embodiment of a switch circuit according to the present invention may be described as follows, with reference to FIG. 5. As shown in FIG. 5, first and second NPN transistors Q5 and Q6 being interconnected at the collectors thereof, are inserted in series between the input terminal Tin, here representing the output of the switch circuit, and ground. Resistors R2 and R3 are respectively connected between the emitters and bases of the transistors Q5 and Q6, in order to increase breakdown the withstand voltage of the transistors Q5 and Q6. The base of the transistor Q5 is connected to the power source Vcc through a third PNP transistor Q7 and a resistor R4. The base of the second transistor Q6 is connected to the power source Vcc through a fourth PNP transistor Q8 and a resistor R5. Fifth and sixth NPN transistor Q9 and Q10 are respectively connected between the bases of the transistors Q7 and Q8 and ground. Inserted between the power source Vcc and ground are a resistor R6, a seventh PNP transistor Q11 and a resistor R7, in this order, from the power source Vcc to ground. Similarly connected between the power source Vcc and ground are a resistor R8, an eighth PNP transistor Q12 and a resistor R9, in this order, from the power source to ground. A control signal S is applied to the bases of transistors Q11 and Q12, to control the ON and OFF state of these transistors. The collectors of transistors Q11 and Q12 are connected to the bases of transistors Q9 and Q10, respectively. The ON/OFF state of transistors Q9 and Q10 is controlled by the collector current of transistors Q11 and Q12.

The operation of the switch circuit thus arranged may be described as follows.

(1) When the control signal S is at a low level:

Under such conditions, transistors Q11 and Q12 are turned ON and the collector currents of these transistors turn on transistors Q9 and Q10, respectively. Then, the bases of transistors Q7 and Q8 are connected to ground, through transistors Q9 and Q10. Accordingly, transistors Q7 and Q8 are turned ON, so that the base current is fed from the power source Vcc to the base of transistor Q5, through resistor R4 and the third transistor Q7; and to the base of the second transistor Q6, through resistor R5 and the fourth transistor Q8. Then, transistors Q5 and Q6 are both turned ON, and the switch circuit is thus in an ON state. In this case, the input terminal Tin is ground.

(2) When the control signal S is at a high level:

Under such conditions, transistors Q11 and Q12 are turned OFF, and the bases of transistors Q9 and Q10 are grounded through resistors R7 and R9, respectively. Therefore, transistors Q9 and Q10 are both turned OFF, as are transistors Q7 and Q8. Accordingly, transistors Q5 and Q6 are also turned OFF, and the switch circuit is thus in an OFF state. In this way, the circuit of FIG. 5 operates as a switch circuit.

When the first and second transistors Q5 and Q6 are both OFF, if an AC voltage is applied to the input terminal Tin, breakdown the withstand voltage in the positive half cycle of the AC voltage is determined by breakdown the withstand voltage between the collector and base of the second transistor Q6. The breakdown withstand voltage in the negative half cycle is determined by the breakdown withstand voltage between the collector and base of the transistor Q5. Therefore, the breakdown withstand voltage of the switch circuit may be increased, against the positive and negative peak values, by using transistors with a large breakdown withstand voltage between the collector and the base electrodes used for transistors Q5 and Q6.

In the circuit shown in FIG. 5, the reference voltage may be set at ground level by using a single power source Vcc. The breakdown withstand voltage of the switch circuit may be increased, against the positive and negative peak values with respect to ground level, if a transistor with a large breakdown withstand voltage between the collector and base is used for transistors Q5 and Q6. Since the emitters of the first and second transistors Q5 and Q6 are not in an open state, the withstand voltage in the positive and negative half cycles is limited by breakdown withstand voltages $V_{CER5}$ and $V_{CER6}$, when the collector-emitter of both transistors Q5 and Q6 is reverse biased.

As described above, according to the present invention, the reference voltage may be set at ground level, even with a single power source. The switch circuit has a large breakdown withstand voltage against the input signal with positive and negative large peaks, with respect to ground level. Further, the switch circuit is easily adaptable for use with integrated circuits.

What is claimed is:

1. A switch circuit, having a control input terminal and an output terminal, comprising:

first and second transistors, for receiving an input voltage, each having a collector and emitter and a base, the collectors of said first and second transistors being interconnected, the emitter of said first transistor being connected to said output terminal, and the emitter of said second transistor being connected to ground;

a first series circuit comprising a first resistor and a third transistor connected in series thereto, said third transistor having a collector, an emitter and a base, one terminal of said first resistor being connected to a constant power source potential, the other terminal of said first resistor being connected to one terminal of an electric current path of the emitter and the collector of said third transistor, and the other terminal of said electric current path of said third transistor being connected to the base of said first transistor;

a second series circuit comprising a second resistor and a fourth transistor connected in series thereto, said fourth transistor having a collector, an emitter and a base, one terminal of said second resistor being connected to said constant power source potential, the other terminal of said second resistor being connected to one terminal of an electric current path of the emitter and the collector of said fourth transistor, and the other terminal of said electric current path of said fourth transistor being connected to the base of said second transistor; and bias circuit means connected to the bases of said third and fourth transistors, having a first state and a second state, for receiving at said control input terminal a control signal switchable between first and second levels, said bias circuit means changing from said first state to said second state in accordance with a change in said control signal from said first level to said second level, thereby changing the state of conduction of said third and fourth transistors simultaneously to switch the voltage level at said output terminal.

2. A switch circuit according to claim 1, further comprising:
   a third resistor connected across said base and emitter of said first transistor; and
   a fourth resistor connected across the base and emitter of said first transistor.

3. A switch circuit according to claim 1, wherein said bias circuit means comprises fifth, sixth, seventh and eighth transistors each having a collector, an emitter and a base, one terminal of an electric current path of the emitter and the collector of said fifth transistor being connected to said power source potential, the other terminal of said electric current path of said fifth transistor being connected to ground, the base of said fifth transistor being connected to said control signal, one terminal of an electric current path of the emitter and the collector of said sixth transistor being connected to the base of said third transistor, the other terminal of said electric current path of said sixth transistor being connected to ground, the base of said sixth transistor being connected to the collector of said fifth transistor, one terminal of an electric current path of the emitter and the collecter of said seventh transistor being connected to said power source potential, the other terminal of said electric current path of said seventh transistor being connected to ground, the base of said seventh transistor being connected to said control input terminal, one terminal of an electric current path of the emitter and the collector of said eighth transistor being connected to the base of said fourth transistor, the other terminal of said electric current path of said eighth transistor being connected to ground, and the base of said eighth transistor being connected to the collector of said seventh transistor.

4. A switch circuit according to claim 3, wherein said first, second, sixth and eighth transistors are of NPN type, and said third, fourth, fifth and seventh transistors are of PNP type.

* * * * *